(12) United States Patent
Hoekman et al.

(10) Patent No.: US 12,321,006 B2
(45) Date of Patent: Jun. 3, 2025

(54) DIFFRACTIVE BACKLIGHT FABRICATION METHOD

(71) Applicant: LEIA INC., Menlo Park, CA (US)

(72) Inventors: Thomas Hoekman, Menlo Park, CA (US); David A. Fattal, Menlo Park, CA (US); Ming Ma, Menlo Park, CA (US); Zhen Peng, Menlo Park, CA (US)

(73) Assignee: LEIA SPV LLC, Menlo Park, CA (US)

( * ) Notice: Subject to any disclaimer, the term of this patent is extended or adjusted under 35 U.S.C. 154(b) by 730 days.

(21) Appl. No.: 17/510,072

(22) Filed: Oct. 25, 2021

(65) Prior Publication Data
US 2022/0050377 A1 Feb. 17, 2022

Related U.S. Application Data

(63) Continuation of application No. PCT/US2020/029987, filed on Apr. 25, 2020.
(Continued)

(51) Int. Cl.
*F21V 8/00* (2006.01)
*B29D 11/00* (2006.01)
(Continued)

(52) U.S. Cl.
CPC ...... *G02B 6/0065* (2013.01); *B29D 11/00769* (2013.01); *G02B 6/0036* (2013.01);
(Continued)

(58) Field of Classification Search
CPC ............ B29D 11/00769; G02B 6/0065; G02B 6/0036; G02B 6/0051; G02B 6/0055;
(Continued)

(56) References Cited

U.S. PATENT DOCUMENTS

| 7,215,850 B2 | 5/2007 | Maisenhoelder et al. |
| 9,128,226 B2 | 9/2015 | Fattal et al. |
| (Continued) | | |

FOREIGN PATENT DOCUMENTS

| CA | 3136673 | 11/2020 |
| CA | 3136670 | 4/2024 |
| (Continued) | | |

OTHER PUBLICATIONS

"U.S. Appl. No. 17/509,036, Non Final Office Action mailed Feb. 29, 2024", 11 pgs.
(Continued)

*Primary Examiner* — Wyatt A Stoffa
*Assistant Examiner* — Mitchell T Oestreich
(74) *Attorney, Agent, or Firm* — Schwegman, Lundberg & Woessner, P.A.

(57) ABSTRACT

Diffractive backlight fabrication employs a diffraction grating to scatter light from a light guide and define a reflective island that is aligned with the diffraction grating. A method of fabricating a diffractive backlight includes providing the light guide having the diffraction grating, diffractively scattering guided light out of the light guide using the diffraction grating to selectively expose photoresist and provide an opening in the photoresist, and depositing a reflective material into the opening to form a reflective island that is aligned with the diffraction grating. A reflective diffraction grating element of the diffractive backlight includes the diffraction grating and reflective island.

13 Claims, 5 Drawing Sheets

Related U.S. Application Data (60) Provisional application No. 62/839,736, filed on Apr. 28, 2019.

(51) Int. Cl.
*G03F 7/00* (2006.01)
*G03F 7/11* (2006.01)
*G03F 7/20* (2006.01)

(52) U.S. Cl.
CPC ......... *G02B 6/0051* (2013.01); *G02B 6/0055* (2013.01); *G03F 7/0002* (2013.01); *G03F 7/001* (2013.01); *G03F 7/11* (2013.01); *G03F 7/2008* (2013.01)

(58) Field of Classification Search
CPC .......... G03F 7/11; G03F 7/001; G03F 7/0002; G03F 7/2008
USPC ....................................................... 359/558
See application file for complete search history.

(56) References Cited

U.S. PATENT DOCUMENTS

| | | | |
|---|---|---|---|
| 9,201,270 | B2 | 12/2015 | Fattal et al. |
| 9,298,168 | B2 | 3/2016 | Taff et al. |
| 9,389,415 | B2 | 7/2016 | Fattal et al. |
| 9,459,461 | B2 | 10/2016 | Santori et al. |
| 9,557,466 | B2 | 1/2017 | Fattal |
| 9,785,119 | B2 | 10/2017 | Taff et al. |
| 10,345,505 | B2 | 7/2019 | Fattal |
| 10,649,128 | B2 | 5/2020 | Fattal et al. |
| 10,712,501 | B2 | 7/2020 | Fattal |
| 10,830,939 | B2 | 11/2020 | Fattal et al. |
| 10,838,134 | B2 | 11/2020 | Fattal et al. |
| 10,928,677 | B2 | 2/2021 | Aieta et al. |
| 10,942,307 | B2 | 3/2021 | Li et al. |
| 10,948,647 | B2 | 3/2021 | Fattal |
| 11,048,036 | B2 | 6/2021 | Ma et al. |
| 12,124,073 | B2 | 10/2024 | Hoekman et al. |
| 2004/0169929 | A1 | 9/2004 | Sato et al. |
| 2009/0296193 | A1 | 12/2009 | Bita et al. |
| 2009/0322986 | A1 | 12/2009 | Wei et al. |
| 2012/0200807 | A1 | 8/2012 | Wei et al. |
| 2013/0169518 | A1 | 7/2013 | Wu et al. |
| 2016/0091775 | A1 | 3/2016 | Gibson et al. |
| 2017/0307800 | A1* | 10/2017 | Fattal .................. G02B 6/0038 |
| 2017/0363794 | A1 | 12/2017 | Wan et al. |
| 2018/0011237 | A1 | 1/2018 | Fattal |
| 2018/0024287 | A1 | 1/2018 | Shim et al. |
| 2018/0052501 | A1 | 2/2018 | Jones, Jr. et al. |
| 2018/0129060 | A1 | 5/2018 | Lee et al. |
| 2018/0172893 | A1 | 6/2018 | Fattal et al. |
| 2018/0210146 | A1 | 7/2018 | Klug et al. |
| 2019/0011625 | A1 | 1/2019 | Wang et al. |
| 2019/0011635 | A1 | 1/2019 | Lai et al. |
| 2019/0227382 | A1 | 7/2019 | Watanabe et al. |
| 2020/0064552 | A1* | 2/2020 | Fattal .................... G02B 30/33 |
| 2020/0218011 | A1 | 7/2020 | Li et al. |
| 2021/0086407 | A1 | 3/2021 | Peng et al. |
| 2021/0240005 | A1 | 8/2021 | Fattal et al. |
| 2022/0043200 | A1 | 2/2022 | Hoekman et al. |

FOREIGN PATENT DOCUMENTS

| | | |
|---|---|---|
| CN | 108027532 | 5/2018 |
| CN | 113748373 | 3/2024 |
| EP | 3963256 | 3/2022 |
| EP | 3963390 | 3/2022 |
| HK | 40062455 | 6/2022 |
| JP | 2010033772 | 2/2010 |
| JP | 2018503230 | 2/2018 |
| JP | 2018509645 | 4/2018 |
| JP | 2022531173 | 7/2022 |
| JP | 7227403 | 2/2023 |
| KR | 20040075430 A | 8/2004 |
| KR | 20050065416 | 6/2005 |
| KR | 20110028595 A | 3/2011 |
| KR | 20150046513 A | 4/2015 |
| KR | 20160119896 | 10/2016 |
| KR | 20170092035 | 8/2017 |
| KR | 20170103755 | 9/2017 |
| KR | 20170125937 | 11/2017 |
| KR | 20190025554 | 3/2019 |
| KR | 20210138804 | 11/2021 |
| TW | I510820 B | 12/2015 |
| TW | 202105754 | 2/2021 |
| TW | 1744878 | 11/2021 |
| WO | 2012038856 A1 | 3/2012 |
| WO | 2016111707 | 7/2016 |
| WO | 2017164871 | 9/2017 |
| WO | 2019066873 | 4/2019 |
| WO | 2020206151 A1 | 10/2020 |
| WO | 2020223134 A1 | 11/2020 |
| WO | 2020223135 | 11/2020 |

OTHER PUBLICATIONS

"Nanoimprint lithography", [Online]. Retrieved from the Internet: https: en.wikipedia.org wlindex.php?title=Nanoimprint_lithographyandoldid=1186194394, (Jan. 18, 2024).

"U.S. Appl. No. 17/509,036, Restriction Requirement mailed Oct. 27, 2023", 6 pgs.

"U.S. Appl. No. 17/509,036, Response filed Dec. 23, 2023 to Restriction Requirement mailed Oct. 27, 2023", 6 pgs.

"International Application Serial No. PCT US2020 029986, International Search Report mailed Aug. 14, 2020", 3 pgs.

"International Application Serial No. PCT US2020 029986, Written Opinion mailed Aug. 14, 2020", 5 pgs.

"International Application Serial No. PCT US2020 029986, International Preliminary Report on Patentability mailed Nov. 11, 2021", 7 pgs.

"Korean Application Serial No. 10-2021-7036899, Notice of Preliminary Rejection mailed Apr. 1, 2024", w English Translation, 11 pgs.

"International Application Serial No. PCT US2020 029987, International Preliminary Report on Patentability mailed Nov. 11, 2021", 6 pgs.

"European Application Serial No. 20798945.0, Response to Communication pursuant to Rules 161(2) and 162 EPC filed Jun. 8, 2022", 18 pgs.

"European Application Serial No. 20798945.0, Extended European Search Report mailed Jan. 2, 2023", 4 pgs.

"European Application Serial No. 20798945.0, Response filed Jun. 13, 2023 to Extended European Search Report mailed Jan. 2, 2023", 1 pg.

"European Application Serial No. 20798945.0, Intention to Grant mailed Aug. 2, 2023", 61 pgs.

"Canadian Application Serial No. 3,136,673, Voluntary Amendment filed Oct. 8, 2021", 25 pgs.

"Chinese Application Serial No. 202080032100.6, Office Action mailed Jun. 5, 2023", W English Translation, 9 pgs.

"U.S. Appl. No. 17/509,036, Response filed May 7, 2024 to Non Final Office Action mailed Feb. 29, 2024", 9 pgs.

International Search Report and Written Opinion (ISRWO) by International Searching Authority (ISA) Korean Intellectual Property Office (KIPO) dated Aug. 11, 2020 (10 pages) for foreign counterpart parent International Application No. PCT/US2020/029987.

Fattal, David et al., "A multi-directional backlight for a wide-angle, glasses-free three-dimensional display," Nature, Mar. 21, 2013, pp. 348-351, vol. 495, Macmillan Publishers Limited, 2013.

Kee, Edwin., "Hitachi Full Parallax 3D Display Offers Mind Bending Visuals," http://www.ubergizmo.com/2011/10/hitachi-full-parallax-3d-display-offers-mind-bending-visuals, Oct. 4, 2011, 2 pages.

Reichelt et al., "Holographic 3-D Displays—Electro-holography within the Grasp of Commercialization," Advances in Lasers and Electro-Optics, Optics, Nelson Costa and Adolfo Cartaxo (Ed.), (56) References Cited

OTHER PUBLICATIONS (2010), pp. 683-711, ISBN: 978-953-307-088-9, InTech, Available from: http://www.intechopen.com/books/advances-in-lasers-and-electro-optics/holographic-3-ddisplays-electro-holography-within-the-grasp-of-commercialization.
Travis et al., "Collimated light from a waveguide for a display backlight," Optics Express, Oct. 2009, pp. 19714-19719, vol. 17, No. 22.
Xu et al., "Computer-Generated Holography for Dynamic Display of 3D Objects with Full Parallax," International Journal of Virtual Reality, 2009, pp. 33-38, vol. 8, No. 2.
Son, Jung-Young et al., "Three-Dimensional Imaging Methods Based on Multiview Images," IEEE/OSA Journal of Display Technology, Sep. 2005, pp. 125-140, vol. 1, No. 1.
"European Application Serial No. 20799116.7, Extended European Search Report mailed May 12, 2023", 11 pgs.
"U.S. Appl. No. 17/509,036, Notice of Allowance mailed Jun. 20, 2024", 8 pgs.
"Korean Application Serial No. 10-2021-7036899, Response filed Jul. 18, 2024 to Notice of Preliminary Rejection mailed Apr. 1, 2024", w English claims, 15 pgs.
"European Application Serial No. 20799116.7, Response to Communication pursuant to Rules 161(2) and 162 EPC filed Jun. 8, 2022", 21 pgs.
"European Application Serial No. 20799116.7, Response filed Nov. 14, 2023 to Extended European Search Report mailed May 12, 2023", 14 pgs.

\* cited by examiner

DIFFRACTIVE BACKLIGHT FABRICATION METHOD

CROSS-REFERENCE TO RELATED APPLICATIONS

This application is a continuation patent application of and claims priority to International Patent Application No. PCT/US2020/029987, filed Apr. 25, 2020, which claims the benefit of priority to U.S. Provisional Patent Application Ser. No. 62/839,736, filed Apr. 28, 2019, the entire contents of both of which are herein incorporated by reference.

STATEMENT REGARDING FEDERALLY SPONSORED RESEARCH OR DEVELOPMENT

N/A

BACKGROUND

Electronic displays are a nearly ubiquitous medium for communicating information to users of a wide variety of devices and products. Among the most commonly found electronic displays are the cathode ray tube (CRT), plasma display panels (PDP), liquid crystal displays (LCD), electroluminescent displays (EL), organic light emitting diode (OLED) and active matrix OLEDs (AMOLED) displays, electrophoretic displays (EP) and various displays that employ electromechanical or electrofluidic light modulation (e.g., digital micromirror devices, electrowetting displays, etc.). In general, electronic displays may be categorized as either active displays (i.e., displays that emit light) or passive displays (i.e., displays that modulate light provided by another source). Among the most obvious examples of active displays are CRTs, PDPs and OLEDs/AMOLEDs. Displays that are typically classified as passive when considering emitted light are LCDs and EP displays. Passive displays, while often exhibiting attractive performance characteristics including, but not limited to, inherently low power consumption, may find somewhat limited use in many practical applications given the lack of an ability to emit light.

To overcome the limitations of passive displays associated with emitted light, many passive displays are coupled to an external source of light. The coupled source of light may allow these otherwise passive displays to emit light and function substantially as an active display. Examples of such coupled sources of light are backlights. Backlights are sources of light (often panels) that are placed behind an otherwise passive display to illuminate the passive display. For example, a backlight may be coupled to an LCD or an EP display. The backlight emits light that passes through the LCD or the EP display. The light emitted is modulated by the LCD or the EP display and the modulated light is then emitted, in turn, from the LCD or the EP display.

BRIEF DESCRIPTION OF THE DRAWINGS

Various features of examples and embodiments in accordance with the principles described herein may be more readily understood with reference to the following detailed description taken in conjunction with the accompanying drawings, where like reference numerals designate like structural elements, and in which.

DETAILED DESCRIPTION

Examples and embodiments in accordance with the principles described herein methods of fabricating diffractive backlights with application to electronic displays of various types. In particular, various method of fabricating diffractive backlights according to the principles described herein employ a diffraction grating to scatter light from a light guide to expose a photoresist and define a reflective island that is aligned with the diffraction grating. As such, the method of diffractive backlight fabrication may provide a self-aligned fabrication of a reflective diffraction grating element that includes the diffraction grating and the reflective island. In addition to self-aligned fabrication of the reflective diffraction grating element of the diffractive backlight, the methods of diffractive backlight fabrication described herein may also be tolerant to translation and stretch between reflective diffractive grating elements across an extent of the diffractive backlight as well as may facilitate fabrication of large-area diffractive backlights for electronic display applications, according to various embodiments. Electronic displays that may employ diffractive backlights fabricated according to the methods described herein may include, but are not limited to, multiview displays and other similar displays, e.g., autostereoscopic or 'glasses-free' three-dimensional (3D) displays.

Herein a 'two-dimensional display' or '2D display' is defined as a display configured to provide a view of an image that is substantially the same regardless of a direction from which the image is viewed (i.e., within a predefined viewing angle or range of the 2D display). A conventional liquid crystal display (LCD) found in many smart phones and computer monitors are examples of 2D displays. In contrast herein, a 'multiview display' is defined as an electronic display or display system configured to provide different views of a multiview image in or from different view directions. In particular, the different views may represent different perspective views of a scene or object of the multiview image. Uses of unilateral backlighting and unilateral multiview displays described herein include, but are not limited to, mobile telephones (e.g., smart phones), watches, tablet computers, mobile computers (e.g., laptop computers), personal computers and computer monitors, automobile display consoles, cameras displays, and various other mobile as well as substantially non-mobile display applications and devices.

Figure 1A:
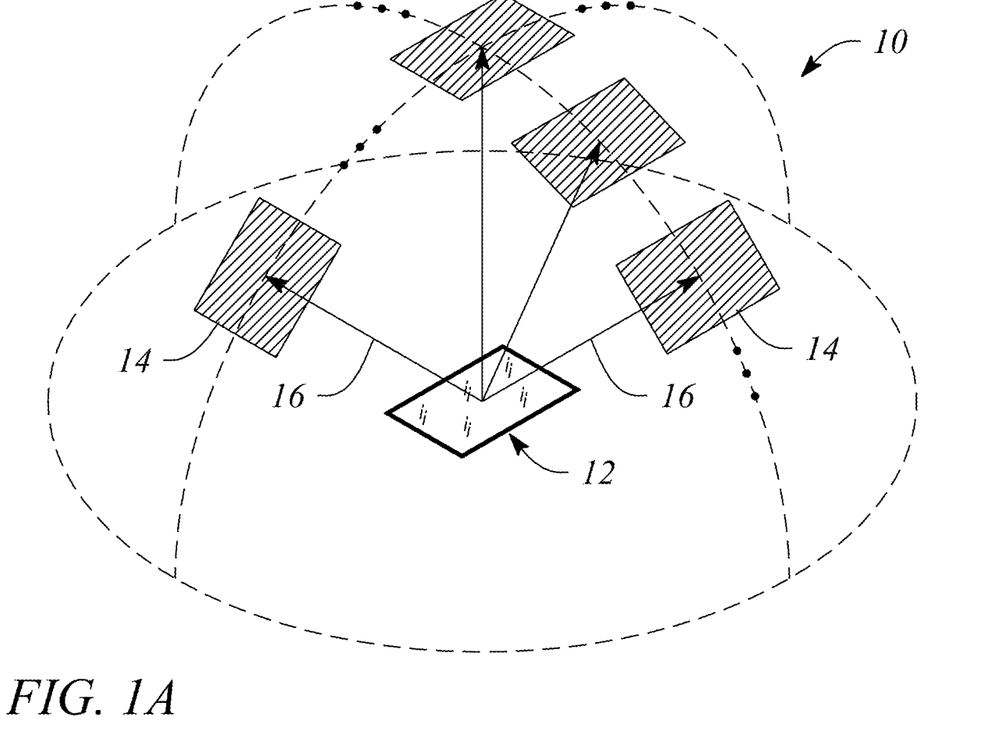
FIG. 1A illustrates a perspective view of a multiview display 10 in an example, according to an embodiment consistent with the principles described herein.

FIG. 1A illustrates a perspective view of a multiview display 10 in an example, according to an embodiment consistent with the principles described herein. As illustrated in FIG. 1A, the multiview display 10 comprises a screen 12 to display a multiview image to be viewed. The screen 12 may be a display screen of a telephone (e.g., mobile telephone, smart phone, etc.), a tablet computer, a laptop computer, a computer monitor of a desktop computer, a camera display, or an electronic display of substantially any other device, for example.

The multiview display 10 provides different views 14 of the multiview image in different view directions 16 relative to the screen 12. The view directions 16 are illustrated as arrows extending from the screen 12 in various different principal angular directions; the different views 14 are illustrated as shaded polygonal boxes at the termination of the arrows (i.e., depicting the view directions 16); and only four views 14 and four view directions 16 are illustrated, all by way of example and not limitation. Note that while the different views 14 are illustrated in FIG. 1A as being above the screen, the views 14 actually appear on or in a vicinity of the screen 12 when the multiview image is displayed on the multiview display 10. Depicting the views 14 above the screen 12 is only for simplicity of illustration and is meant to represent viewing the multiview display 10 from a respective one of the view directions 16 corresponding to a particular view 14. A 2D display may be substantially similar to the multiview display 10, except that the 2D Display is generally configured to provide a single view (e.g., one view similar to view 14) of a displayed image as opposed to the different views 14 of the multiview image provided by the multiview display 10.

A view direction or equivalently a light beam having a direction corresponding to a view direction of a multiview display generally has a principal angular direction given by angular components $\{\theta, \phi\}$, by definition herein. The angular component $\theta$ is referred to herein as the 'elevation component' or 'elevation angle' of the light beam. The angular component $\phi$ is referred to as the 'azimuth component' or 'azimuth angle' of the light beam. By definition, the elevation angle $\theta$ is an angle in a vertical plane (e.g., perpendicular to a plane of the multiview display screen while the azimuth angle $\phi$ is an angle in a horizontal plane (e.g., parallel to the multiview display screen plane).

Figure 1B:
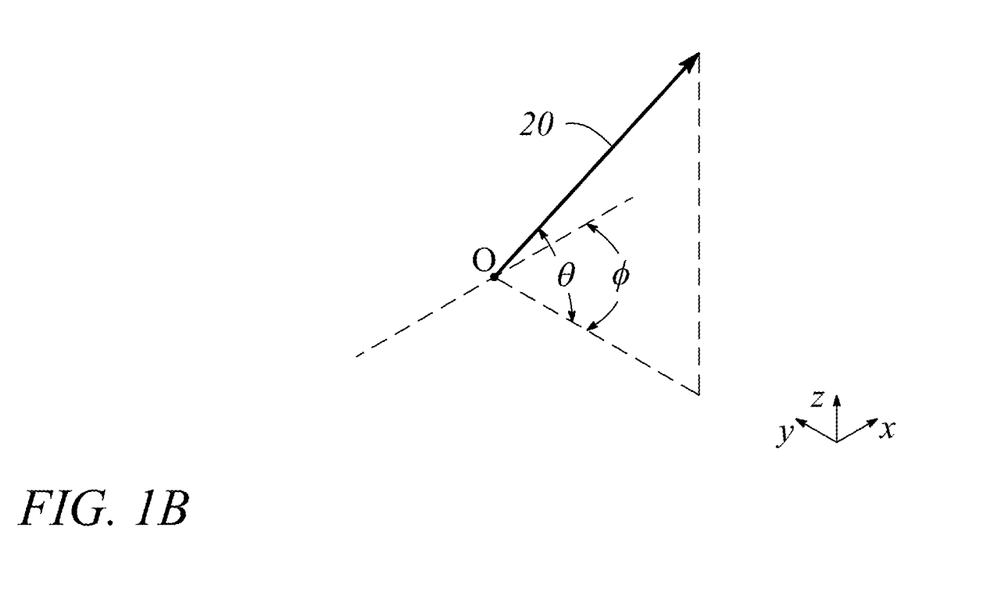
FIG. 1B illustrates a graphical representation of the angular components of a light beam having a particular principal angular direction corresponding to a view direction of a multiview display in an example, according to an embodiment consistent with the principles described herein.

FIG. 1B illustrates a graphical representation of the angular components $\{\theta, \phi\}$ of a light beam 20 having a particular principal angular direction corresponding to a view direction (e.g., view direction 16 in FIG. 1A) of a multiview display in an example, according to an embodiment consistent with the principles described herein. In addition, the light beam 20 is emitted or emanates from a particular point, by definition herein. That is, by definition, the light beam 20 has a central ray associated with a particular point of origin within the multiview display. FIG. 1B also illustrates the light beam (or view direction) point of origin O.

Herein, a 'light guide' is defined as a structure that guides light within the structure using total internal reflection. In particular, the light guide may include a core that is substantially transparent at an operational wavelength of the light guide. The term 'light guide' generally refers to a dielectric optical waveguide that employs total internal reflection to guide light at an interface between a dielectric material of the light guide and a material or medium that surrounds that light guide. By definition, a condition for total internal reflection is that a refractive index of the light guide is greater than a refractive index of a surrounding medium adjacent to a surface of the light guide material. In some embodiments, the light guide may include a coating in addition to or instead of the aforementioned refractive index difference to further facilitate the total internal reflection. The coating may be a reflective coating, for example. The light guide may be any of several light guides including, but not limited to, one or both of a plate or slab guide and a strip guide.

According to various embodiments, the light guide itself may comprise an optically transparent material configured to guide light by total internal reflection. Any of a variety of optically transparent materials may be employed in the light guide including, but not limited to, one or more of various types of glass (e.g., silica glass, alkali-aluminosilicate glass, borosilicate glass, etc.) and substantially optically transparent plastics or polymers (e.g., poly(methyl methacrylate) or 'acrylic glass', polycarbonate, etc.).

Further herein, the term 'plate' when applied to a light guide as in a 'plate light guide' is defined as a piecewise or differentially planar layer or sheet, which is sometimes referred to as a 'slab' guide. In particular, a plate light guide is defined as a light guide configured to guide light in two substantially orthogonal directions bounded by a top surface and a bottom surface (i.e., opposite surfaces) of the light guide. Further, by definition herein, the top and bottom surfaces are both separated from one another and may be substantially parallel to one another in at least a differential sense. That is, within any differentially small section of the plate light guide, the top and bottom surfaces are substantially parallel or co-planar.

In some embodiments, the plate light guide may be substantially flat (i.e., confined to a plane) and therefore, the plate light guide is a planar light guide. In other embodiments, the plate light guide may be curved in one or two orthogonal dimensions. For example, the plate light guide may be curved in a single dimension to form a cylindrical shaped plate light guide. However, any curvature has a radius of curvature sufficiently large to insure that total internal reflection is maintained within the plate light guide to guide light. By definition herein, a 'light guide substrate' is a substrate that comprises a light guide, e.g., a plate light guide.

Herein, a 'diffraction grating' is generally defined as a plurality of features (i.e., diffractive features) arranged to provide diffraction of light incident on the diffraction grating. In some examples, the plurality of features may be arranged in a periodic or quasi-periodic manner. For example, the diffraction grating may include a plurality of features (e.g., a plurality of grooves or ridges in a material surface) arranged in a one-dimensional (1D) array. In other examples, the diffraction grating may be a two-dimensional (2D) array of features. The diffraction grating may be a 2D array of bumps on or holes in a material surface, for example.

As such, and by definition herein, the 'diffraction grating' is a structure that provides diffraction of light incident on the diffraction grating. If the light is incident on the diffraction grating from a light guide, the provided diffraction or diffractive scattering may result in, and thus be referred to as, 'diffractive coupling' in that the diffraction grating may couple light out of the light guide by diffraction. The diffraction grating also redirects or changes an angle of the light by diffraction (i.e., at a diffractive angle). In particular, as a result of diffraction, light leaving the diffraction grating generally has a different propagation direction than a propagation direction of the light incident on the diffraction grating (i.e., incident light). The change in the propagation direction of the light by diffraction is referred to as 'diffractive redirection' herein. Hence, the diffraction grating may be understood to be a structure including diffractive features that diffractively redirects light incident on the diffraction grating and, if the light is incident from a light guide, the diffraction grating may also diffractively couple out the light from the light guide.

Further, by definition herein, the features of a diffraction grating are referred to as 'diffractive features' and may be one or more of at, in and on a material surface (i.e., a boundary between two materials). The surface may be a surface of a light guide, for example. The diffractive features may include any of a variety of structures that diffract light including, but not limited to, one or more of grooves, ridges, holes and bumps at, in or on the surface. For example, the diffraction grating may include a plurality of substantially parallel grooves in the material surface. In another example, the diffraction grating may include a plurality of parallel ridges rising out of the material surface. The diffractive features (e.g., grooves, ridges, holes, bumps, etc.) may have any of a variety of cross sectional shapes or profiles that provide diffraction including, but not limited to, one or more of a sinusoidal profile, a rectangular profile (e.g., a binary diffraction grating), a triangular profile and a saw tooth profile (e.g., a blazed grating).

According to various examples described herein, a diffraction grating (e.g., a diffraction grating of a multibeam element, as described below) may be employed to diffractively scatter or couple light out of a light guide (e.g., a plate light guide) as a light beam. In particular, a diffraction angle of or provided by a locally periodic diffraction grating may be given by equation (1) as:

$$\theta_m = \sin^{-1}\left(n\sin\theta_i - \frac{m\lambda}{d}\right) \quad (1)$$

where $\lambda$ is a wavelength of the light, m is a diffraction order, n is an index of refraction of a light guide, d is a distance or spacing between features of the diffraction grating, $\theta_i$ is an angle of incidence of light on the diffraction grating. For simplicity, equation (1) assumes that the diffraction grating is adjacent to a surface of the light guide and a refractive index of a material outside of the light guide is equal to one (i.e., $n_{out}=1$). In general, the diffraction order m is given by an integer. A diffraction angle $\theta_m$ of a light beam produced by the diffraction grating may be given by equation (1) where the diffraction order is positive (e.g., m>0). For example, first-order diffraction is provided when the diffraction order m is equal to one (i.e., m=1).

Figure 2:
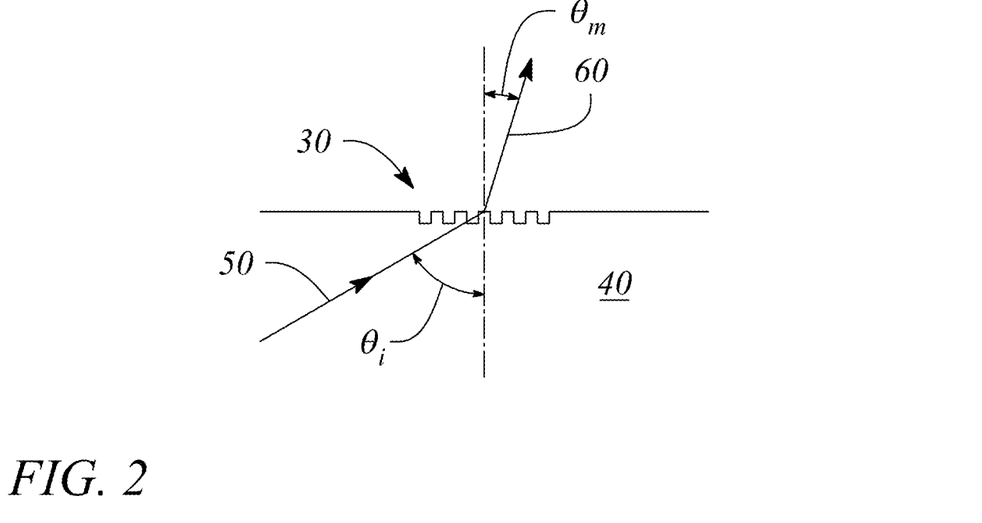
FIG. 2 illustrates a cross sectional view of a diffraction grating in an example, according to an embodiment consistent with the principles described herein.

FIG. 2 illustrates a cross sectional view of a diffraction grating 30 in an example, according to an embodiment consistent with the principles described herein. For example, the diffraction grating 30 may be located on a surface of a light guide 40. In addition, FIG. 2 illustrates a light beam 50 incident on the diffraction grating 30 at an incident angle $\theta_i$. The light beam 50 is a guided light beam within the light guide 40. Also illustrated in FIG. 2 is a directional light beam 60 diffractively produced and coupled-out by the diffraction grating 30 as a result of diffraction of the incident light beam 50. The directional light beam 60 has a diffraction angle $\theta_m$ (or 'principal angular direction' herein) as given by equation (1). The diffraction angle $\theta_m$ may correspond to a diffraction order 'm' of the diffraction grating 30, for example. In some embodiments, the diffraction grating may be a sub-wavelength diffraction grating having one or both of a diffractive feature size and a diffractive feature spacing that is less than a wavelength $\lambda$ is a wavelength of the light that is diffracted by the diffraction grating.

In some embodiments, the diffraction grating may be a uniform diffraction grating or having a uniform or substantially uniform spacing of diffractive features (i.e., the grating pitch) across an extent of the diffraction grating. For example, the uniform diffraction grating may comprise a plurality of diffractive features, each diffractive feature of the diffractive feature plurality being of a similar size to and having a similar spacing from an adjacent diffractive feature.

In other embodiments, the diffraction grating may comprise a plurality of subgratings. Different subgratings of the subgrating plurality may have different characteristics from each other, in some embodiments. For example, subgratings may comprising one or both of a different diffractive feature spacing and a different diffractive feature orientation from other subgratings of the subgrating plurality. In some embodiments, the diffractive features of the subgratings may be curved, e.g., the diffractive features may comprise one or both of curved grooves or ridges.

In some embodiments, the subgratings of the subgrating plurality may be arranged in an array. The array may be either a one-dimensional (1D) array or a two-dimensional (2D) array, according to various embodiments. Further, the diffraction grating may comprise a plurality of subgrating arrays that repeat across the extent of the diffraction grating, in some embodiments. In other embodiments, the different subgratings of the subgrating plurality may be distributed substantially randomly across the extent of the diffraction grating.

In other embodiments, the diffraction grating may comprise a chirped diffraction grating or even an array of chirped diffraction gratings. By definition, the 'chirped' diffraction grating is a diffraction grating exhibiting or having a diffraction spacing of the diffractive features that varies across an extent or length of the chirped diffraction grating. In some embodiments, the chirped diffraction grating may have or exhibit a chirp of the diffractive feature spacing that varies linearly with distance. As such, the chirped diffraction grating is a 'linearly chirped' diffraction grating, by definition. In other embodiments, the chirped diffraction grating may exhibit a non-linear chirp of the diffractive feature spacing. Various non-linear chirps may be used including, but not limited to, an exponential chirp, a logarithmic chirp or a chirp that varies in another, substantially non-uniform or random but still monotonic manner. Non-monotonic chirps such as, but not limited to, a sinusoidal chirp or a triangle or sawtooth chirp, may also be employed. In some embodiments, subgratings of the diffraction grating may comprise a chirped diffraction grating.

Herein a 'collimator' is defined as substantially any optical device or apparatus that is configured to collimate light. According to various embodiments, an amount of collimation provided by the collimator may vary in a predetermined degree or amount from one embodiment to another. Further, the collimator may be configured to provide collimation in one or both of two orthogonal directions (e.g., a vertical direction and a horizontal direction). That is, the collimator may include a shape in one or both of two orthogonal directions that provides light collimation, according to some embodiments.

Herein, a 'collimation factor' is defined as a degree to which light is collimated. In particular, a collimation factor defines an angular spread of light rays within a collimated beam of light, by definition herein. For example, a collimation factor σ may specify that a majority of light rays in a beam of collimated light is within a particular angular spread (e.g., +/−σ degrees about a central or principal angular direction of the collimated light beam). The light rays of the collimated light beam may have a Gaussian distribution in terms of angle and the angular spread may be an angle determined by at one-half of a peak intensity of the collimated light beam, according to some examples.

Herein, a 'light source' is defined as a source of light (e.g., an optical emitter configured to produce and emit light). For example, the light source may comprise an optical emitter such as a light emitting diode (LED) that emits light when activated or turned on. In particular, herein the light source may be substantially any source of light or comprise substantially any optical emitter including, but not limited to, one or more of a light emitting diode (LED), a laser, an organic light emitting diode (OLED), a polymer light emitting diode, a plasma-based optical emitter, a fluorescent lamp, an incandescent lamp, and virtually any other source of light. The light produced by the light source may have a color (i.e., may include a particular wavelength of light), or may be a range of wavelengths (e.g., white light). In some embodiments, the light source may comprise a plurality of optical emitters. For example, the light source may include a set or group of optical emitters in which at least one of the optical emitters produces light having a color, or equivalently a wavelength, that differs from a color or wavelength of light produced by at least one other optical emitter of the set or group. The different colors may include primary colors (e.g., red, green, blue) for example.

Herein, 'nanoimprint lithography' is defined as using a mold or patterning tool to transfer a pattern to an imprintable surface of a substrate through or using an imprinting process, where features represented in the mold or patterning tool comprise a nanoscale size or a nanoscale tolerance. In some examples, the imprintable surface may comprise a material of the substrate itself that is relatively softer than the mold. In another example, the imprintable surface may comprise a layer of a relatively softer material deposited on or applied over a surface the substrate. In either case, the relatively softer material of the imprintable surface is configured to receive and retain the imprinted pattern after the mold is removed and during further processing. A surface of the softer material that receives the mold during imprinting is referred to herein as the 'receiving layer' or 'receiving surface.'

In some embodiments, the relatively softer material may be cured or hardened during imprinting to facilitate retention of the imprinted pattern. Curing essentially 'freezes' or fixes the receiving layer in a shape or pattern determined by the mold. For example, a layer of a photo-curable material such as, but not limited to, a photo-activated monomer, oligomer, or polymer, (e.g., photoresist) that hardens when exposed to light (e.g., infrared, visible or ultraviolet (UV) illumination) may be used as the receiving layer. Prior to curing, the photo-curable material is soft (e.g., liquid or semi-liquid) and readily accepts the mold imprint pattern. Upon exposure to light, the photo-curable material cures around the mold. The cured photo-curable material of the receiving layer thus retains the imprint pattern of the mold.

In another example, a thermoplastic material applied as a layer or film to a surface of the substrate may be used as the receiving layer. Prior to imprinting, the thermoplastic material layer is heated to about a glass transition temperature of the material, thereby softening the material. The mold is pressed into the softened material and the material is cooled to below the glass transition temperature causing the material to harden or cure around the impressed mold. The imprinted pattern is retained by the cured thermoplastic material. Examples of thermoplastic polymers that are used as the receiving layer include, but not limited to, polycarbonate, poly(methyl methacrylate) (PMMA) and methyl methacrylate (MMA).

In some embodiments, the imprinted pattern formed in the soft material layer may be then further 'transferred' into the substrate as a positive image of the mold through lithography and etching, for example. The transferred pattern is further processed to form the features in the substrate. Such features are typically nanometer-scale in size. The features may be transferred using a dry etching technique such as, but not limited to, reactive ion etching (ME) and plasma etching or a wet chemical etching technique to selectively remove the substrate material and form the features. The molded receiving layer may also be etched or even removed using one or both of the dry and wet etching techniques, according to some embodiments.

Further, as used herein, the article 'a' is intended to have its ordinary meaning in the patent arts, namely 'one or more'. For example, 'a reflective island' means one or more reflective islands and as such, 'the reflective island' means 'reflective island(s)' herein. Also, any reference herein to 'top', 'bottom', 'upper', 'lower', 'up', 'down', 'front', back', 'first', 'second', 'left' or 'right' is not intended to be a limitation herein. Herein, the term 'about' when applied to a value generally means within the tolerance range of the equipment used to produce the value, or may mean plus or minus 10%, or plus or minus 5%, or plus or minus 1%, unless otherwise expressly specified. Further, the term 'substantially' as used herein means a majority, or almost all, or all, or an amount within a range of about 51% to about 100%. Moreover, examples herein are intended to be illustrative only and are presented for discussion purposes and not by way of limitation.

Figure 3:
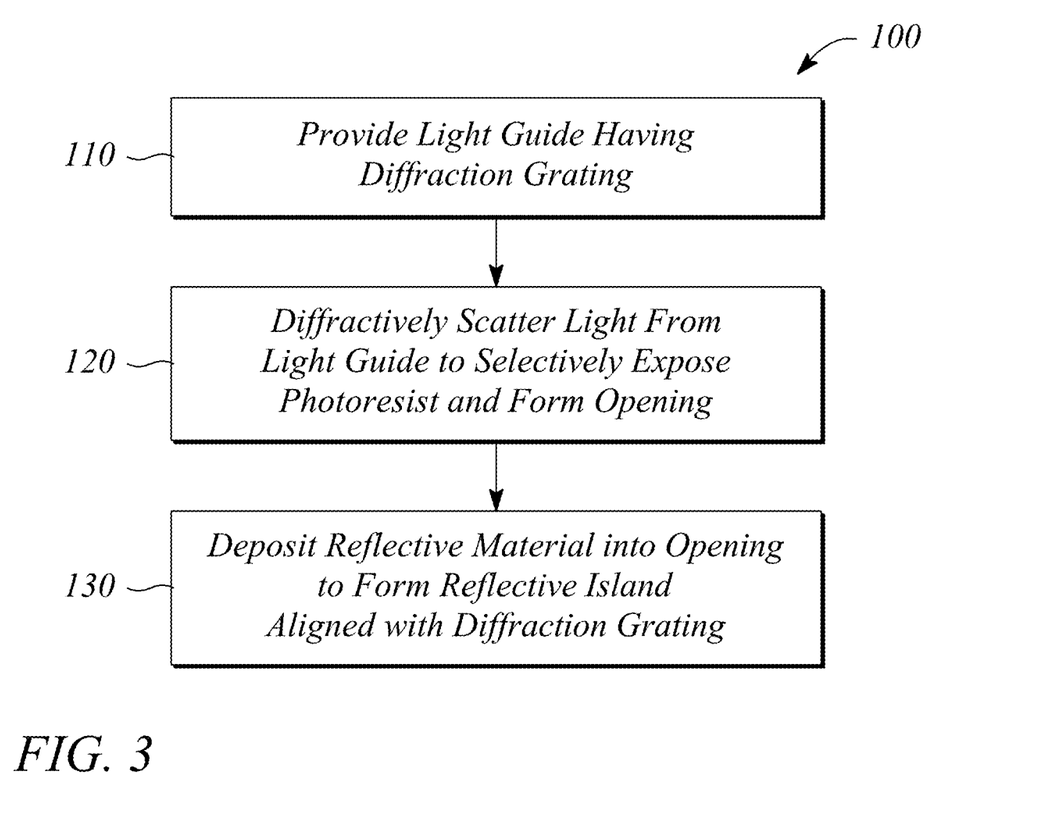
FIG. 3 illustrates flow chart of a method of fabricating a diffractive backlight in an example, according to an embodiment consistent with the principles described herein.

According to some embodiments of the principles described herein, a method of fabricating a diffractive backlight is provided. FIG. 3 illustrates flow chart of a method 100 of fabricating a diffractive backlight in an example, according to an embodiment consistent with the principles described herein. As illustrated, the method 100 of fabricating a diffractive backlight comprises providing 110 a light guide having a diffraction grating. According to some embodiments, the diffraction grating may be at a surface of the light guide. For example, the diffraction grating may be located at or adjacent to a front (top) surface or a bottom (back) surface of the light guide. In other examples, the diffraction grating may be located within the light guide, e.g., between a pair of surfaces (e.g., guiding surfaces) of the light guide. According to some embodiments, the diffraction grating is substantially smaller in extent than the light guide. For example, a size of the diffraction grating may be less than ten percent (10%), or less than five percent (5%), or less than one percent (1%), or less than one tenth of a percent (0.1%) of an extent or overall size of the light guide. For example, in some embodiments, the diffraction grating may be between about one quarter and two times a size of a light valve in a display that employs the diffractive backlight.

In some embodiments, providing 110 a light guide having a diffraction grating may comprise nanoimprinting a surface of the light guide using a nanoimprint mold to form the diffraction grating in the light guide surface. In some of these embodiments, nanoimprinting a surface of the light guide using a nanoimprint mold may comprise applying a nanoimprint receiving layer to a surface of the light guide, and then pressing the nanoimprint mold into the nanoimprint receiving layer to form the diffraction grating. For example, the nanoimprint receiving layer may comprise a transparent plastic or polymer such as, but not limited to, polycarbonate, poly(methyl methacrylate) (PMMA) or 'acrylic glass' and methyl methacrylate (MMA) that is applied to a surface of the light guide. In other embodiments, providing 110 a light guide having a diffraction grating may comprise nanoimprinting the surface of the light guide itself, i.e., pressing the nanoimprint mold directly into the light guide surface. For example, the light guide may comprise a material such as, but not limited to, PMMA, MMA or polycarbonate, that is formable by nanoimprinting. As such, the nanoimprint receiving layer may comprise a surface region or layer of the light guide material. In other non-limiting embodiments, providing 110 a light guide having a diffraction grating may comprise, but is not limited to, defining the diffraction grating within the light guide or on the light guide surface using on or more of photolithography, focused ion beam lithography, and electron beam lithography and may include one or more of dry etching (e.g., reactive ion etching) and wet etching, for example. In yet other embodiments, substantially any method of providing a diffraction grating in or on a light guide may be employed in providing 110 a light guide having a diffraction grating.

The method 100 of fabricating a diffractive backlight illustrated in FIG. 3 further comprises diffractively scattering 120 guided light out of the light guide using the diffraction grating to selectively expose photoresist adjacent to a surface of the light guide. According to various embodiments, the selective exposure provides an opening in the photoresist that is aligned with the diffraction grating. In particular, the opening may be substantially similar in size and extent to the diffraction grating, only light that is scattered out of the light guide by the diffraction grating is available to expose the photoresist. All other areas of the photoresist remain unexposed given that the guided light is confined within the light guide by total internal reflection. The photoresist may be positive photoresist, for example.

In some embodiments, diffractively scattering 120 guided light out of the light guide using the diffraction grating comprises guiding light along a length of the light guide according to total internal reflection. According to these embodiments, diffractively scattering 120 guided light out of the light guide using the diffraction grating further comprises diffractively scattering a portion of the guided light out of the light guide using the diffraction grating. In some embodiments, the guided light comprises one or both of blue light and ultraviolet light provided by a light source that is optically connected to an edge of the light guide.

As illustrated, the method 100 of fabricating a diffractive backlight further comprises depositing 130 a reflective material into the opening to form a reflective island aligned with the diffraction grating, as illustrated in FIG. 3. For example, the reflective material may comprise, but is not limited to, one or more of a metal, a metal polymer (e.g., polymer aluminum), and a high-index dielectric, according to various embodiments. The reflective material may be deposited 130 into the opening by or using one or more of evaporative deposition, sputter deposition, or an equivalent, for example. According to various embodiments, a reflective diffraction grating element of the diffractive backlight comprises a combination of the diffraction grating and the reflective island.

In other embodiments, depositing 130 a reflective material into the opening to form a reflective island comprises depositing a layer of the reflective material on a surface of the photoresist and into the opening in the photoresist. In these embodiments, depositing 130 a reflective material into the opening further comprises lifting off the photoresist to leave only the reflective material that was within the opening. Lifting off the photoresist may comprise applying a solvent to dissolve the photoresist and then washing away the dissolved photoresist along with the overlying reflective material, for example.

In some embodiments, the light guide may comprise a light guide substrate, a layer of high-index material, and a layer of low index material. The layer of high-index material may be disposed on a surface of the light guide substrate and is sandwiched between the low-index material and the light guide substrate. According to various embodiments, the high-index material has a refractive index that is greater than a refractive index of the light guide substrate and the low-index material has a refractive index that is less than the refractive index of the high-index material. The guided light is guided by total internal reflection at an interface between the high-index material layer and the low-index material layer, according to these embodiments. In some embodiments, the high-index material of the high-index material layer extends into diffractive features of the diffraction grating at or in the surface of the light guide substrate.

In some embodiments (not illustrated), the method 100 of fabricating a diffractive backlight further comprises etching an opening in the low-index material layer through the opening in the photoresist to expose the high-index material layer. In these embodiments, depositing a reflective material into the opening to form a reflective island may comprise depositing a layer of the reflective material on a surface of the photoresist and into the opening in the photoresist and the opening in the low-index material layer and lifting off the photoresist to leave only the reflective material that was within the openings and on a surface of the of the high-index material layer. The method 100 of fabricating a diffractive backlight may further comprise removing the low-index material layer from the light guide, in some embodiments.

Figure 4:
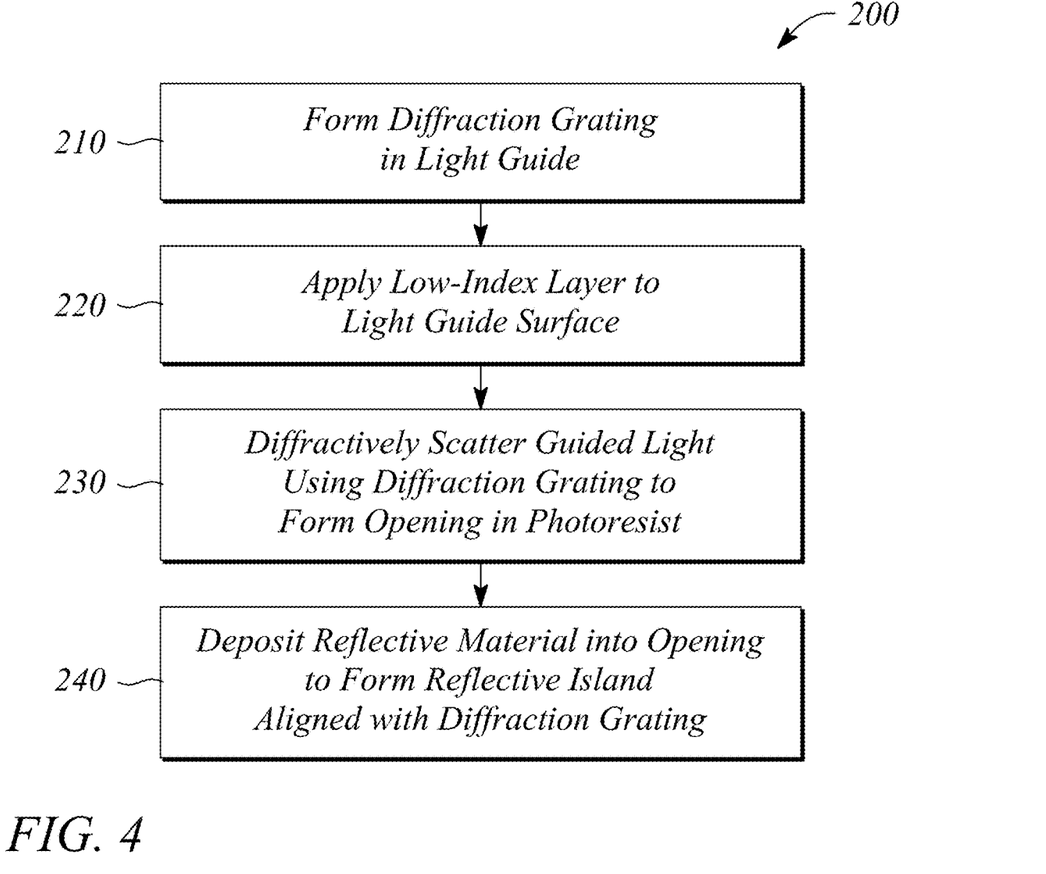
FIG. 4 illustrates flow chart of a method of diffractive backlight self-aligned fabrication in an example, according to an embodiment consistent with the principles described herein.

In accordance with other embodiments of the principles described herein, a method of diffractive backlight self-aligned fabrication is provided. FIG. 4 illustrates flow chart of a method 200 of diffractive backlight self-aligned fabrication in an example, according to an embodiment consistent with the principles described herein. As illustrated, the method 200 of diffractive backlight self-aligned fabrication comprises forming 210 a diffraction grating in a light guide. In some embodiments, forming 210 a diffraction grating may employ techniques substantially similar to those describe above with respect to providing 110 a light guide having a diffraction grating. For example, forming 210 a diffraction grating may comprise nanoimprinting the diffraction grating in a surface of the light guide by pressing a nanoimprint mold into the surface, the nanoimprint mold having a pattern corresponding to the diffraction grating.

The method 200 of diffractive backlight self-aligned fabrication illustrated in FIG. 4 further comprises applying 220 a layer of low-index material on a surface of the light guide. The refractive index of the low-index material is less than a refractive index the light guide, according to various embodiments. In some embodiment (not illustrated in FIG. 4), the method 200 of diffractive backlight self-aligned fabrication further comprises applying a layer of high-index material between the low-index material layer and the light guide. A refractive index of the high-index material is greater than the refractive index of the low-index material, according to these embodiments.

As illustrated in FIG. 4, the method 200 of diffractive backlight self-aligned fabrication further comprises applying 220 a photoresist to the low-index material layer. The photoresist may be positive photoresist, for example.

According to various embodiments, the method 200 of diffractive backlight self-aligned fabrication illustrated in FIG. 4 further comprises diffractively scattering 230 light guided in the light guide using the diffraction grating to selectively provide an opening in the photoresist. Diffractively scattering 230 light guided in the light guide may be substantially similar to diffractively scattering 120 guided light out of the light guide using the diffraction grating of the above-described method 100 of fabricating a diffractive backlight, in some embodiments. In particular, diffractively scattering 230 light guided in the light guide may comprise introducing light into an edge of the light guide using a light source, the introduced light comprising one or both of blue light and ultraviolet light. Diffractively scattering 230 light guided in the light guide may then further comprise using the diffractive grating to diffractively scatter out a portion of the guided light, but only in an immediate vicinity of the diffraction grating, as described above, i.e., the diffraction grating effectively overcomes the total internal reflection of the light guide to enable light to exit the light guide at the diffraction grating.

The method 200 illustrated in FIG. 4 further comprises depositing 240 a reflective material within the opening to form a reflective island aligned with and having an extent corresponding to the diffraction grating. According to various embodiments, a reflective diffraction grating element of the diffractive backlight comprises a combination of the reflective island and the diffraction grating.

In some embodiments, depositing 240 a reflective material within the opening to form a reflective island may be substantially similar to depositing 130 a reflective material into the opening to form a reflective island, described above with respect to the method 100 of fabricating a diffractive backlight. For example, the reflective material may comprise, but is not limited to, one or more of a metal, a metal polymer (e.g., polymer aluminum), and a high-index dielectric, according to various embodiments. The reflective material may be deposited 240 within the opening by or using one or more of evaporative deposition, sputter deposition, or an equivalent, for example. Further, in some embodiments, depositing 240 a reflective material within the opening may comprise depositing a layer of the reflective material on a surface of the photoresist and into the opening in the photoresist and lifting off the photoresist to leave only the reflective material that was within the opening.

In some embodiments (not illustrated in FIG. 4), the method 200 of diffractive backlight self-aligned fabrication may further comprise using the opening in the photoresist to etch a corresponding opening through the low-index material layer. In these embodiments, depositing the reflective material into the opening forms the reflective island within both the opening in the photoresist and the corresponding opening through the low-index material layer. In some embodiments (not illustrated in FIG. 4), the method 200 of diffractive backlight self-aligned fabrication may further comprise removing the low-index material layer. In some embodiments, the light guide may have a layer of high-index material on the light guide surface, the high-index material having a refractive index that is greater than the refractive index of the light guide. Further, depositing the reflective material may deposits the reflective material onto the high-index material layer, in these embodiments.

Example

An example of diffractive backlight fabrication and self-aligned diffractive backlight fabrication according to one or both of above-described methods 100 and 200 are presented below. The examples illustrate results of employing the aforementioned methods, by way of example and not limitation.

FIGS. 5A-5G illustrate cross sectional views of fabricating a diffractive backlight 300 in an example, according to an embodiment of the principles described herein. In particular, FIGS. 5A-5G illustrate the diffractive backlight 300 comprising a light guide 310. In some embodiments, the light guide 310 may substantially similar to either the light guide substrate or the light guide described above with respect to the method 100 of fabricating a diffractive backlight and the method 200 of self-aligned diffractive backlight fabrication. Further, as illustrated, the light guide has a diffraction grating 312 at a surface of the light guide 310, e.g., a front or top surface, as illustrate by way of example and not limitation.

Figure 5A:
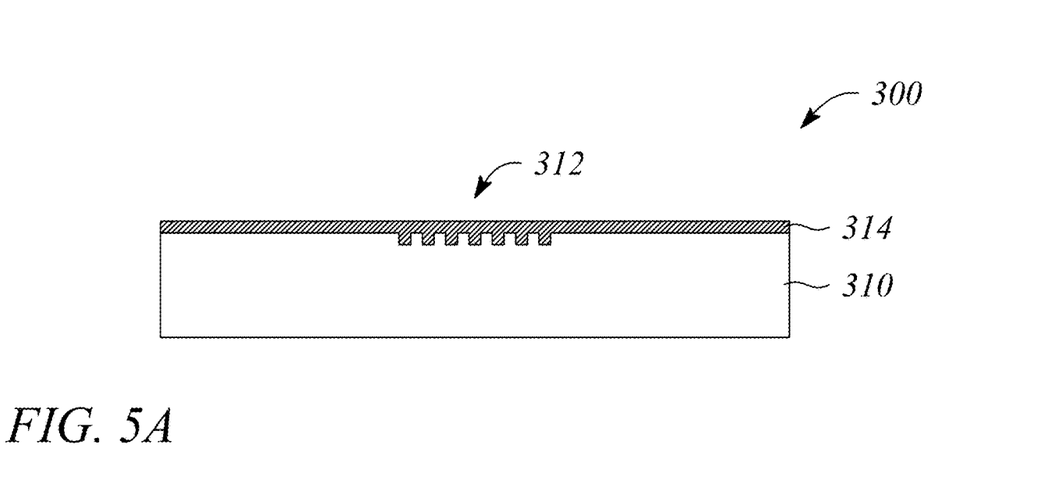
FIGS. 5A-5G illustrate cross sectional views of fabricating a diffractive backlight in an example, according to an embodiment of the principles described Certain examples and embodiments have other features that are one of in addition to and in lieu of the features illustrated in the above-referenced figures. These and other features are detailed below with reference to the above-referenced figures.

FIG. 5A illustrates the light guide 310 and diffraction grating 312 of the diffractive backlight 300 and further illustrates an optional layer of high-index material 314 on the light guide surface. As illustrated, the high-index material extends into diffractive features of the diffraction grating 312 in the surface of the light guide 310.

Figure 5B:
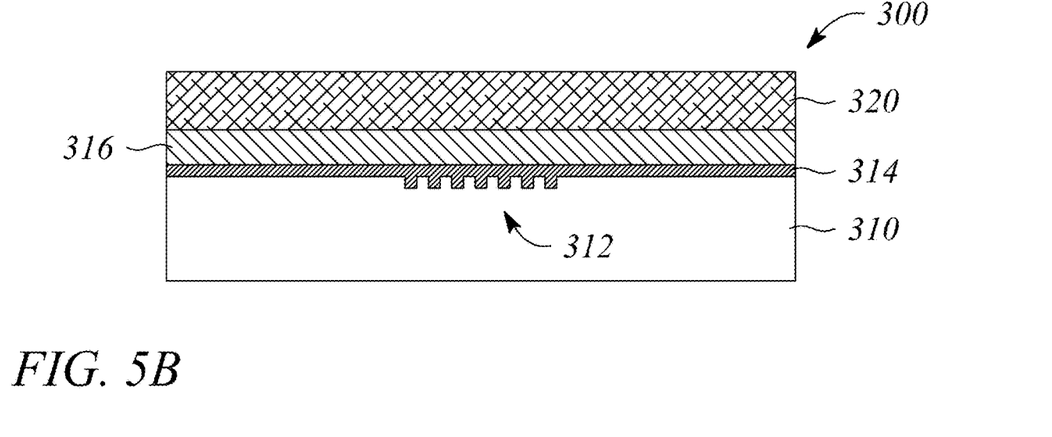

FIG. 5B illustrates the diffractive backlight 300 with a layer of low-index material 316 on a surface of the high-index material 314. As illustrated, the high-index material is sandwiched between the low-index material 316 and the light guide 310. FIG. 5B also illustrates a layer of photoresist 320. The photoresist 320 is illustrated on the low-index material 316. However, the photoresist 320 may be on one of the surface of the light guide or the high-index material, in other embodiments. As described above, the photoresist 320 may be a positive resist, in various embodiments.

Figure 5C:
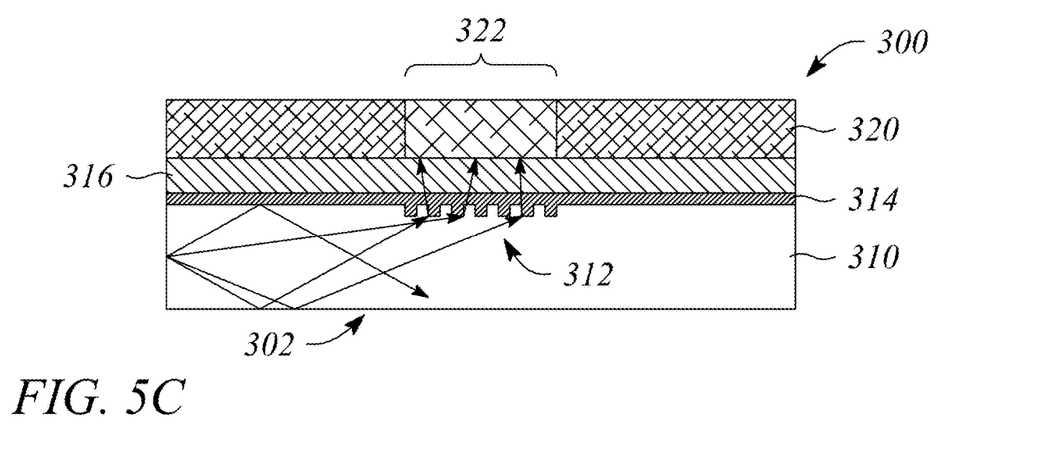

FIG. 5C illustrates exposing the photoresist 320 by diffractively scattering guided light out of the light guide 310. The guided light and the diffractively scattered out light are illustrated in FIG. 5C as arrows 302. The guided light may be provided by a light source (not illustrated) that provides one or both of blue and ultraviolet (UV) light, for examples. An exposed portion 322 of the photoresist 320 is illustrated adjacent to and aligned with the diffraction grating 312. According to some embodiments, exposing the photoresist 320, as illustrated, may be substantially similar to diffractively scattering 120 guided light out of the light guide using the diffraction grating of the above-described method 100 of fabricating a diffractive backlight and diffractively scattering 230 light guided in the light guide using the diffraction grating of the method 200 of self-aligned diffractive backlight fabrication, also described above.

Figure 5D:
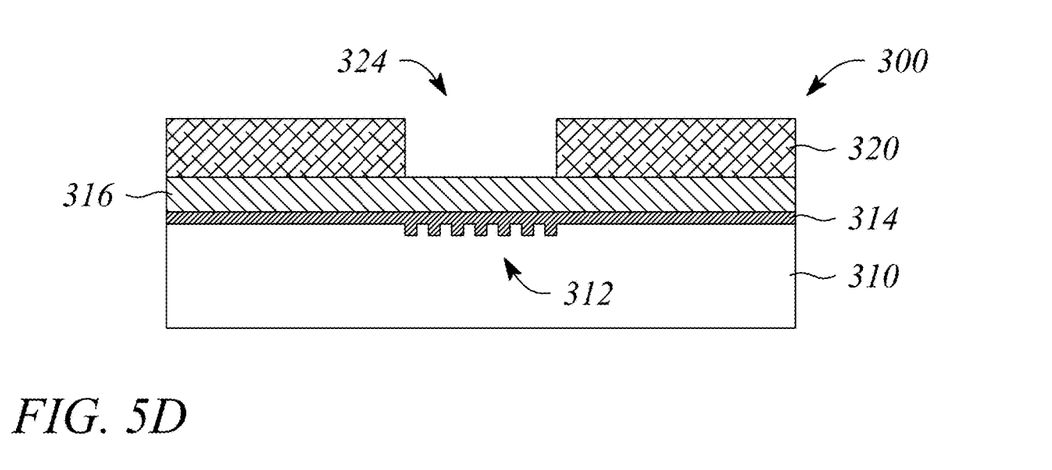
Figure 5E:
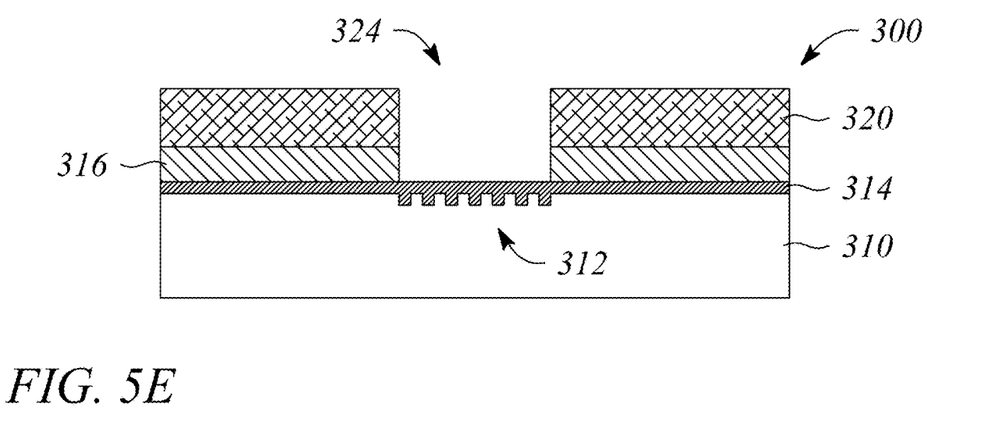

FIG. 5D illustrates the diffractive backlight 300 after developing and removing the exposed portion 322 of the photoresist 320 to provide an opening 324 in the photoresist 320. Removal of the exposed portion exposes the low-index material 316 within the opening 324. FIG. 5E illustrates the diffractive backlight 300 after etching the exposed low-index material 316. After etching, the high-index material 314 is exposed in the opening 324 in the photoresist 320.

Figure 5F:
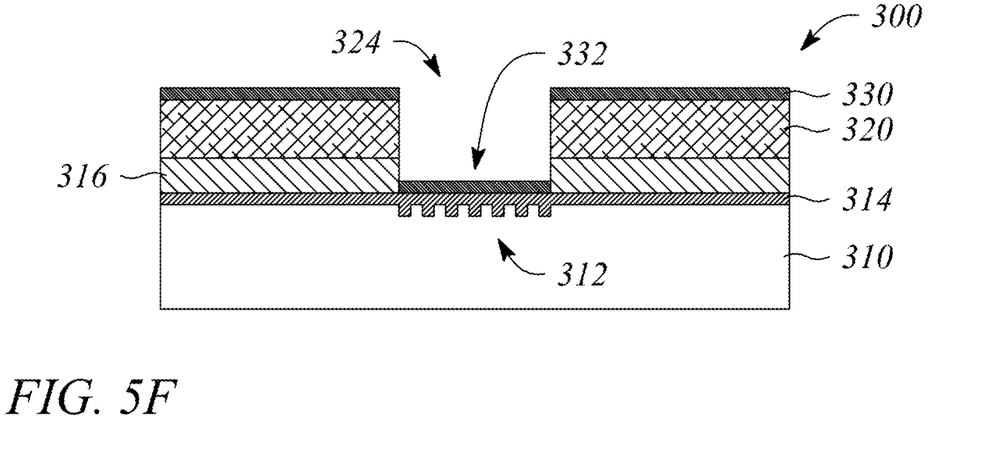

FIG. 5F illustrates the diffractive backlight 300 after depositing reflective material 330 into the opening 324 to form a reflective island 332. As illustrated, the reflective island 332 is aligned with the diffraction grating 312 by virtue of a location of the opening 324. According to some embodiments, depositing reflective material 330 into the opening 324 may be substantially similar to depositing 130, 240 a reflective material, as described above with respect to the methods 100, 200.

Figure 5G:
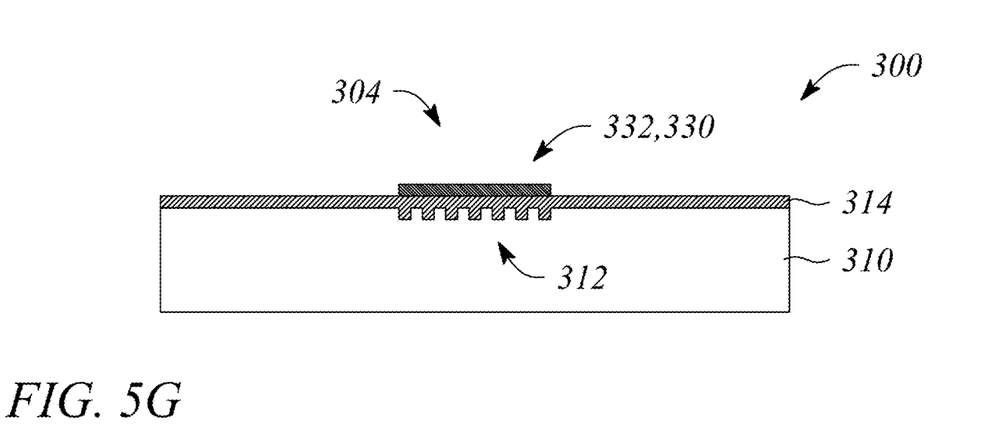

FIG. 5G illustrates the diffractive backlight 300 after removal of the photoresist 320 and the low-index material 316 from the light guide 310 and layer of high-index material 314 on the light guide surface. As illustrated, the diffractive backlight 300 comprises the light guide 310 having the diffraction grating 312 and the reflective island 332 formed from the reflective material 330 and aligned with the diffraction grating 312. Further, FIG. 5G illustrates the result of lifting off the reflective material 330 to leave just a portion of the reflective material 330 corresponding to the reflective island 332. The reflective island 332 and diffraction grating 312 in combination provide the reflective diffraction grating element 304 of the diffractive backlight 300, as illustrated in FIG. 5G.

Thus, there have been described examples and embodiments of methods of fabricating a diffractive backlight that employ a diffraction grating to define a reflective island aligned with the diffraction grating, wherein the reflective island and the grating element comprise a reflective diffraction grating element of the diffractive backlight. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A method of fabricating a diffractive backlight, the method comprising:
    providing a light guide having a diffraction grating;
    diffractively scattering guided light out of the light guide using the diffraction grating to selectively expose photoresist adjacent to a surface of the light guide, selective exposure providing an opening in the photoresist that is aligned with the diffraction grating; and
    depositing a reflective material into the opening to form a reflective island aligned with the diffraction grating,
    wherein a reflective diffraction grating element of the diffractive backlight comprises a combination of the diffraction grating and the reflective island.

2. The method of fabricating a diffractive backlight of claim 1, wherein providing a light guide having a diffraction grating comprises nanoimprinting a surface of the light guide using a nanoimprint mold to form the diffraction grating in the light guide surface.

3. The method of fabricating a diffractive backlight of claim 2, wherein nanoimprinting a surface of the light guide using a nanoimprint mold comprises:
    applying a nanoimprint receiving layer to a surface of the light guide; and
    pressing the nanoimprint mold into the nanoimprint receiving layer to form the diffraction grating.

4. The method of fabricating a diffractive backlight of claim 1, wherein diffractively scattering guided light out of the light guide using the diffraction grating comprises:
    guiding light along a length of the light guide according to total internal reflection as guided light; and
    diffractively scattering a portion of the guided light out of the light guide using the diffraction grating.

5. The method of fabricating a diffractive backlight of claim 4, wherein the guided light comprises one or both of blue light and ultraviolet light provided by a light source that is optically connected to an edge of the light guide.

6. The method of fabricating a diffractive backlight of claim 1, further comprises applying the photoresist to the light guide surface; and
    developing the photoresist after selective exposure by the diffractively scattered portion of the guided light to provide the opening.

7. The method of fabricating a diffractive backlight of claim 1, wherein depositing a reflective material into the opening to form a reflective island comprises:
    depositing a layer of the reflective material on a surface of the photoresist and into the opening in the photoresist; and
    lifting off the photoresist to leave only the reflective material that was within the opening.

8. The method of fabricating a diffractive backlight of claim 1, wherein the light guide comprises:
    a light guide substrate;
    a layer of high-index material on a surface of the light guide substrate, the high-index material having a refractive index that is greater than a refractive index of the light guide substrate; and
    a layer of low-index material having a refractive index that is less than the refractive index of the high-index material, the high-index material being sandwiched between the low-index material layer and the light guide substrate,
    wherein light is guided within the light guide by total internal reflection at an interface between the high-index material layer and the low-index material layer.

9. The method of fabricating a diffractive backlight of claim 8, wherein the high-index material extends into diffractive features of the diffraction grating in the surface of the light guide substrate.

10. The method of fabricating a diffractive backlight of claim 8, further comprising etching an opening in the low-index material layer through the opening in the photoresist to expose the high-index material layer.

11. The method of fabricating a diffractive backlight of claim 10, wherein depositing a reflective material into the opening to form a reflective island comprises:
    depositing a layer of the reflective material on a surface of the photoresist and into the opening in the photoresist and the opening in the low-index material layer; and
    lifting off the photoresist to leave only the reflective material that was within the opening and on a surface of the of the high-index material layer.

12. The method of fabricating a diffractive backlight of claim 11, further comprising removing the low-index material layer from the light guide.

13. The method of fabricating a diffractive backlight of claim 1, wherein the reflective material comprises one or more of a metal, a metal polymer, and a high-index dielectric.

* * * * *

UNITED STATES PATENT AND TRADEMARK OFFICE
CERTIFICATE OF CORRECTION

PATENT NO. : 12,321,006 B2
APPLICATION NO. : 17/510072
DATED : June 3, 2025
INVENTOR(S) : Hoekman et al.

Page 1 of 1

It is certified that error appears in the above-identified patent and that said Letters Patent is hereby corrected as shown below:

In the Claims

In Column 14, Line 53, in Claim 11, delete "of the of the" and insert --of the-- therefor Signed and Sealed this
Fifth Day of August, 2025

Coke Morgan Stewart
*Acting Director of the United States Patent and Trademark Office*